(12) United States Patent
Nishiyama et al.

(10) Patent No.: US 9,146,260 B2
(45) Date of Patent: *Sep. 29, 2015

(54) MAGNETIC BALANCE TYPE CURRENT SENSOR

(71) Applicant: ALPS GREEN DEVICES CO., LTD., Tokyo (JP)

(72) Inventors: Yoshihiro Nishiyama, Niigata-ken (JP); Masamichi Saito, Niigata-ken (JP); Akira Takahashi, Niigata-ken (JP); Masahiro Iizuka, Niigata-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 435 days.

This patent is subject to a terminal disclaimer.

(21) Appl. No.: 13/668,127

(22) Filed: Nov. 2, 2012

(65) Prior Publication Data

US 2013/0057266 A1 Mar. 7, 2013

Related U.S. Application Data

(63) Continuation of application No. PCT/JP2011/059448, filed on Apr. 15, 2011.

(30) Foreign Application Priority Data

Jun. 9, 2010 (JP) ................................. 2010-132212

(51) Int. Cl.
*G01R 33/02* (2006.01)
*G01R 15/20* (2006.01)
*G01R 33/09* (2006.01)

(52) U.S. Cl.
CPC ............ *G01R 15/205* (2013.01); *G01R 33/093* (2013.01)

(58) Field of Classification Search
CPC .......................... G01R 33/093; G01R 33/0011
USPC .................................................. 324/225, 252
See application file for complete search history.

(56) References Cited

U.S. PATENT DOCUMENTS

| 6,252,390 | B1 | 6/2001 | Black, Jr. et al. | |
| 8,269,492 | B2 * | 9/2012 | Saito et al. | 324/252 |
| 8,754,642 | B2 * | 6/2014 | Ide et al. | 324/252 |

(Continued)

FOREIGN PATENT DOCUMENTS

| JP | 9-102109 | 4/1997 |
| JP | 10-312513 | 11/1998 |

(Continued)

OTHER PUBLICATIONS

International Search Report dated Jul. 19, 2011 from International Application No. PCT/JP2011/059448.

*Primary Examiner* — Reena Aurora
(74) *Attorney, Agent, or Firm* — Beyer Law Group LLP

(57) ABSTRACT

A magnetic balance type current sensor includes a magnetic balance type current sensor including a magnetoresistance effect element whose characteristic changes owing to an induction magnetic field from a current to be measured flowing through a conductor, a feedback coil configured to be disposed in the vicinity of the magnetoresistance effect element and generate a cancelling magnetic field cancelling out the induction magnetic field, a magnetic shield configured to attenuate the induction magnetic field and enhance the cancelling magnetic field, and a hard bias layer configured to be provided on or above the magnetic shield.

6 Claims, 3 Drawing Sheets

(56) References Cited

U.S. PATENT DOCUMENTS 8,952,689 B2 * 2/2015 Ide et al. .................. 324/252
2008/0211490 A1 9/2008 Kurata et al.

FOREIGN PATENT DOCUMENTS

| | | |
|---|---|---|
| JP | 2003-59012 | 2/2003 |
| JP | 2004-132790 | 4/2004 |

* cited by examiner

MAGNETIC BALANCE TYPE CURRENT SENSOR

CLAIM OF PRIORITY

This application is a Continuation of International Application No. PCT/JP2011/059448 filed on Apr. 15, 2011, which claims benefit of Japanese Patent Application No. 2010-132212 filed on Jun. 9, 2010. The entire contents of each application noted above are hereby incorporated by reference.

BACKGROUND OF THE INVENTION

1. Field of the Invention

The present invention relates to a magnetic balance type current sensor utilizing a magnetoresistance effect element.

2. Description of the Related Art

The intensity of a current used for driving a motor in an electric automobile is detected by, for example, a current sensor. As such a current sensor, there is a magnetic balance type current sensor. In the magnetic balance type current sensor, if a current to be measured flows, an output voltage occurs in a magnetic detecting element owing to an induction magnetic field according to the current, and a voltage signal output from the magnetic detecting element is converted into a current and fed back to a feedback coil. In addition to this, an operation is performed so that a magnetic field (cancelling magnetic field) occurring owing to the feedback coil and the induction magnetic field occurring owing to the current to be measured cancel out each other and hence a magnetic field constantly becomes zero. At this time, a feedback current flowing through the feedback coil is subjected to voltage conversion and extracted as an output.

As a magnetic detecting element in the above-mentioned magnetic balance type current sensor, for example, a magnetoresistance effect element such as a Giant Magneto Resistance (GMR) element is used. An example of such a magnetic detecting element is described in Japanese Unexamined Patent Application Publication (Translation of PCT Application) No. 2000-516714. In such a magnetic balance type current sensor, a magnetic shield is provided that is used for attenuating the induction magnetic field due to the current to be measured and enhancing the cancelling magnetic field.

SUMMARY OF THE INVENTION

Since a material forming a magnetic shield is a magnetic material and has a magnetic hysteresis, there occurs a problem that the linearity of the output of a magnetoresistance effect element is deteriorated owing to the influence of the magnetic hysteresis of the magnetic shield. For example, if a relationship between a current to be measured (primary current) and linearity (%FS) is studied, when there is no magnetic shield, good linearity is obtained as illustrated in FIG. 4B. On the other hand, when a magnetic shield is provided, linearity is deteriorated as illustrated in FIG. 4A.

In view of the above-mentioned problems, the present invention provides a magnetic balance type current sensor that reduces the influence of the magnetic hysteresis of a magnetic shield and improves the linearity of the output of a magnetoresistance effect element.

The present invention provides a magnetic balance type current sensor including a magnetoresistance effect element whose characteristic changes owing to an induction magnetic field from a current to be measured flowing through a conductor, a feedback coil configured to be disposed in the vicinity of the magnetoresistance effect element and generate a cancelling magnetic field cancelling out the induction magnetic field, a magnetic shield configured to attenuate the induction magnetic field and enhance the cancelling magnetic field, and a hard bias layer configured to be provided on or above the magnetic shield.

According to this configuration, since the hard bias layer is provided on or above the magnetic shield attenuating the induction magnetic field and enhancing the cancelling magnetic field, it may be possible to put the magnetic domain structure of the magnetic shield into a single magnetic domain state. Accordingly, it may be possible to suppress the influence of the magnetic hysteresis of the magnetic shield and improve the linearity of the output of the magnetoresistance effect element.

In the magnetic balance type current sensor according to preferred embodiments of the present invention, it is desirable that the hard bias layer is disposed in both end portions of the magnetic shield in a direction perpendicular to the direction of the induction magnetic field or the direction of the cancelling magnetic field in planar view, and includes a pattern extending in the direction of the induction magnetic field or the direction of the cancelling magnetic field.

In the magnetic balance type current sensor according to preferred embodiments of the present invention, it is desirable that a nonmagnetic layer configured to be provided between the magnetic shield and the hard bias layer is included.

In the magnetic balance type current sensor according to preferred embodiments of the present invention, it is desirable that the feedback coil is disposed between the magnetic shield and the magnetoresistance effect element and the magnetic shield is disposed on a side near the conductor.

In the magnetic balance type current sensor according to preferred embodiments of the present invention, it is desirable that the magnetoresistance effect element is a spin-valve-type GMR element or a spin-valve-type TMR element.

In the magnetic balance type current sensor according to preferred embodiments of the present invention, it is desirable that the magnetic shield is configured by a high magnetic permeability material selected from a group including an amorphous magnetic material, a permalloy-based magnetic material, and an iron-based microcrystalline material.

In the magnetic balance type current sensor according to preferred embodiments of the present invention, it is desirable that the hard bias layer is configured using a hard magnetic material.

DESCRIPTION OF THE PREFERRED EMBODIMENTS

Hereinafter, an embodiment of the present invention will be described in detail with reference to accompanying drawings.

Figure 1:
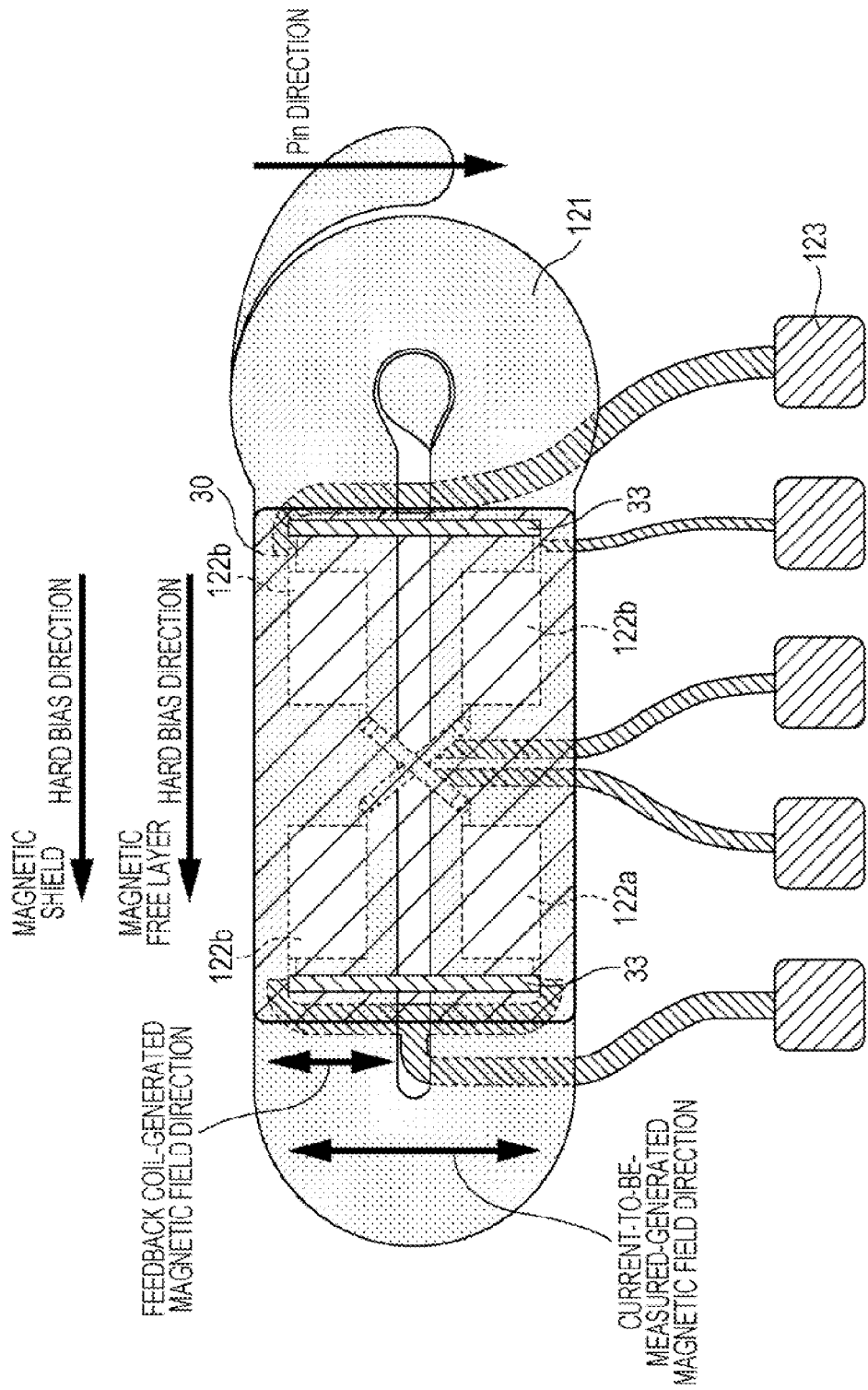
FIG. 1 is a diagram illustrating a magnetic balance type current sensor according to an embodiment of the present invention.

FIG. 1 is a diagram illustrating a magnetic balance type current sensor according to an embodiment of the present invention. In the present embodiment, a magnetic balance type current sensor illustrated in FIG. 1 is arranged in the vicinity of a conductor through which a current to be measured flows. The magnetic balance type current sensor includes a feedback circuit causing a magnetic field (cancelling magnetic field) to occur, the magnetic field negating (cancelling out) an induction magnetic field due to the current to be measured flowing through the conductor. The feedback circuit includes a feedback coil 121 wound in a direction cancelling out the magnetic field occurring owing to the current to be measured, one magnetoresistance effect element 122a serving as a magnetic detecting element, and three fixed resistance elements 122b. In addition, in FIG. 1, a reference symbol 123 indicates an electrode pad electrically connected to the magnetoresistance effect element 122a or the fixed resistance element 122b.

The feedback coil 121 is configured using a planar coil. In this configuration, since no magnetic core is included, it may be possible to manufacture the feedback coil at a low cost. In addition, compared with the case of a toroidal coil, it may be possible to prevent the cancelling magnetic field occurring from the feedback coil from spreading over a wide area and it may be possible to prevent the cancelling magnetic field from influencing a peripheral circuit. Furthermore, compared with the case of the toroidal coil, when the current to be measured is an alternate current, it may be easy to control the cancelling magnetic field due to the feedback coil and a current caused to flow for the control does not become so large. These advantageous effects become large when the current to be measured is an alternate current and becomes a high-frequency wave. When the feedback coil 121 is configured using a planar coil, it is preferable that the planar coil is provided so that both the induction magnetic field and the cancelling magnetic field occur in a surface parallel to the forming surface of the planar coil.

The characteristic (resistance value) of the magnetoresistance effect element 122a changes owing to the induction magnetic field from the current to be measured. The magnetoresistance effect element 122a configures a magnetic field detection bridge circuit along with the three fixed resistance elements 122b. Using the magnetic field detection bridge circuit including the magnetoresistance effect element in this way, it may be possible to realize a highly-sensitive magnetic balance type current sensor.

This magnetic field detection bridge circuit includes two outputs causing a voltage difference to occur, the voltage difference corresponding to the induction magnetic field occurring owing to the current to be measured. These two outputs are amplified by an amplifier, and are applied to the feedback coil 121 as a current (feedback current). This feedback current corresponds to the voltage difference according to the induction magnetic field. At this time, in the feedback coil 121, the cancelling magnetic field cancelling out the induction magnetic field occurs. In addition, on the basis of the current flowing through the feedback coil 121 at the time of an equilibrium state in which the induction magnetic field and the cancelling magnetic field are cancelled out, the current to be measured is measured in a detection unit (detection resistor).

Figure 2:
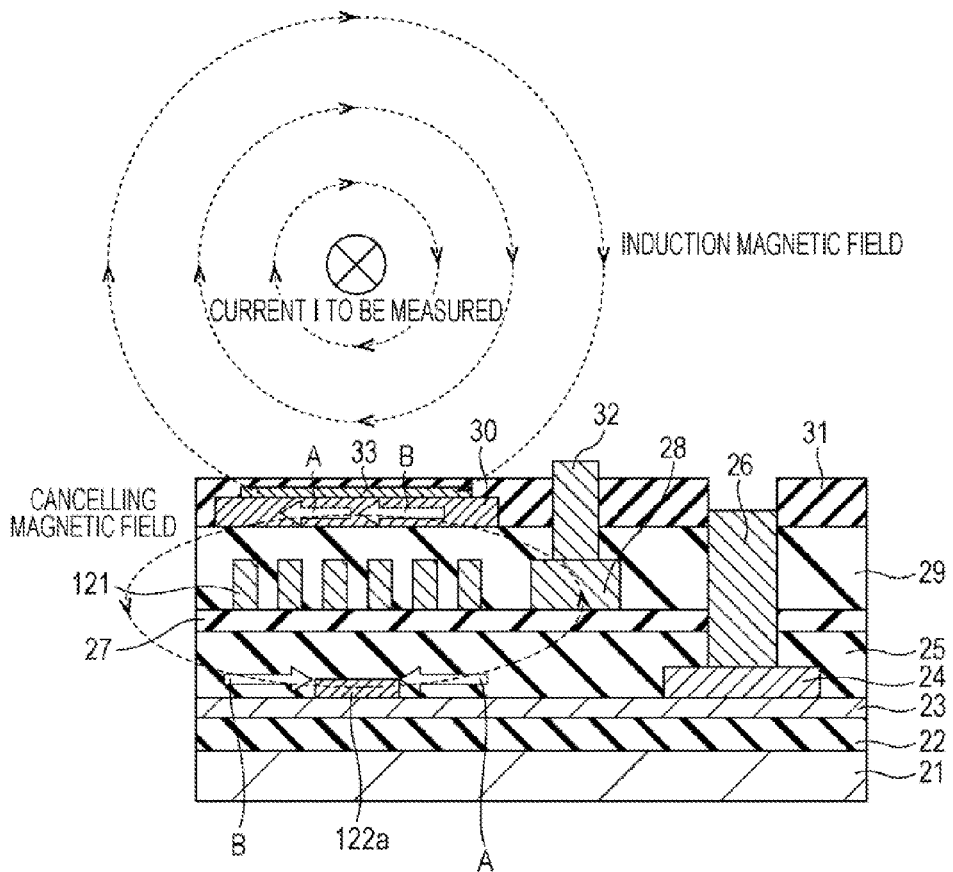
FIG. 2 is a cross-sectional view illustrating the magnetic balance type current sensor illustrated in FIG. 1.

FIG. 2 is a cross-sectional view illustrating the magnetic balance type current sensor illustrated in FIG. 1. As illustrated in FIG. 2, in the magnetic balance type current sensor according to the present embodiment, the feedback coil, a magnetic shield, and the magnetic field detection bridge circuit are formed on a same substrate 21. In the configuration illustrated in FIG. 2, the feedback coil 121 is disposed between a magnetic shield 30 and the magnetoresistance effect element 122a, and the magnetic shield 30 is disposed on a side near the conductor through which the current to be measured flows. In other words, from a side near the conductor, the magnetic shield 30, the feedback coil 121, and the magnetoresistance effect element 122a are disposed in this order. Accordingly, it may be possible to farthest distance the magnetoresistance effect element from the conductor, and it may be possible to reduce the induction magnetic field applied from the current to be measured to the magnetoresistance effect element. In addition, since it may be possible to bring the magnetic shield closest to the conductor, it may be possible to further enhance the attenuation effect of the induction magnetic field. Accordingly, it may be possible to reduce the cancelling magnetic field from the feedback coil.

A layer structure illustrated in FIG. 2 will be described in detail. In the magnetic balance type current sensor illustrated in FIG. 2, a thermal silicon oxide film 22 serving as an insulation layer is formed on the substrate 21. On the thermal silicon oxide film 22, an aluminum oxide film 23 is formed. The aluminum oxide film 23 may be formed as a film by, for example, a method such as sputtering. In addition, a silicon substrate or the like is used as the substrate 21.

On the aluminum oxide film 23, the magnetoresistance effect element 122a is formed. At this time, along with the magnetoresistance effect element 122a, the fixed resistance elements 122b are also provided and the magnetic field detection bridge circuit is formed. As the magnetoresistance effect element 122a, a tunnel-type magnetoresistance effect element (TMR element), a giant magnetoresistance effect element (GMR element), or the like may be used. For example, a spin-valve-type GMR element configured by a multilayer film including an antiferromagnetic layer, a fixed magnetic layer, a nonmagnetic layer, and a free magnetic layer, as the GMR element, or a spin-valve-type TMR element may be used.

As the spin-valve-type GMR element, a GMR element having a meander shape is desirable. Considering the linearity in the meander shape, it is desirable that the width thereof in a pin (Pin) direction is from 1 µm to 10 µm. In this case, considering the linearity, it is desirable that the longitudinal direction is perpendicular to both the direction of the induction magnetic field and the direction of the cancelling magnetic field. With such a meander shape, it may be possible to obtain the output of the magnetoresistance effect element with fewer terminals (two terminals) than Hall elements.

In addition, as the spin-valve-type TMR element, considering the linearity, it is desirable that the spin-valve-type TMR element has a rectangle shape where the width thereof in a pin direction is from 1 µm to 10 µm. In this case, considering the linearity, it is desirable that the longitudinal direction is perpendicular to both the direction of the induction magnetic field and the direction of the cancelling magnetic field.

In addition, on the aluminum oxide film 23, an electrode 24 is formed. The electrode 24 may be formed by photolithography and etching after an electrode material has been formed as a film.

On the aluminum oxide film 23 on which the magnetoresistance effect element 122a and the electrode 24 are formed, a polyimide layer 25 is formed as an insulation layer. The polyimide layer 25 may be formed by applying and curing a polyimide material.

A silicon oxide film 27 is formed on the polyimide layer 25. The silicon oxide film 27 may be formed as a film by, for example, a method such as sputtering.

On the silicon oxide film 27, the feedback coil 121 is formed. The feedback coil 121 may be formed by photolithography and etching after a coil material has been formed as a film. Alternatively, the feedback coil 121 may be formed by photolithography and plating after a base material has been formed as a film.

In addition, on the silicon oxide film 27, a coil electrode 28 is formed in the vicinity of the feedback coil 121. The coil electrode 28 may be formed by photolithography and etching after an electrode material has been formed as a film.

On the silicon oxide film 27 on which the feedback coil 121 and the coil electrode 28 are formed, a polyimide layer 29 is formed as an insulation layer. The polyimide layer 29 may be formed by applying and curing a polyimide material.

The magnetic shield 30 is formed on the polyimide layer 29. The magnetic shield 30 attenuates the induction magnetic field and enhances the cancelling magnetic field. As the configuration material of the magnetic shield 30, a high magnetic permeability material such as an amorphous magnetic material, a permalloy-based magnetic material, or an iron-based microcrystalline material may be used.

On or above the magnetic shield 30, a hard bias layer 33 is provided that suppresses the hysteresis of the magnetic shield 30. As illustrated in FIG. 1, in planar view, the hard bias layer 33 is substantially disposed in both end portions of the magnetic shield 30 in a direction perpendicular to the direction of the induction magnetic field or the direction of the cancelling magnetic field. In addition, the hard bias layer 33 includes a pattern extending in the direction of the induction magnetic field or the direction of the cancelling magnetic field. This hard bias layer 33 is formed using a hard magnetic material such a cobalt-platinum alloy (CoPt).

Figure 3:
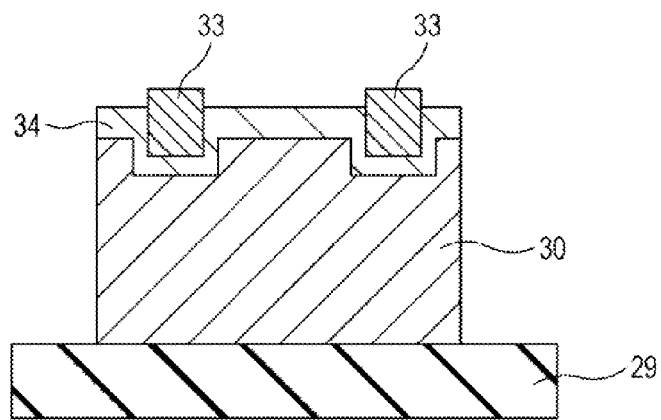
FIG. 3 is a diagram illustrating another example of a magnetic balance type current sensor according to an embodiment of the present invention.

In addition, it is desirable that the formation position, the thickness, the area, and the like of the hard bias layer 33 are arbitrarily set to the extent that an attenuation effect and an enhancing effect the magnetic shield 30 exerts are not deteriorated. In addition, it is desirable that, as illustrated in FIG. 3, a nonmagnetic layer 34 is provided between the magnetic shield 30 and the hard bias layer 33 so that the hard bias layer 33 and the magnetic shield 30 are not directly magnetically coupled to each other. In addition, it is desirable that the thickness of the nonmagnetic layer 34 is arbitrarily set to the extent that the hard bias layer 33 and the magnetic shield 30 are not directly magnetically coupled to each other and the attenuation effect and the enhancing effect the magnetic shield 30 exerts are not deteriorated. As a material forming the nonmagnetic layer 34, an aluminum oxide film or the like may be cited.

On the polyimide layer 29, a silicon oxide film 31 is formed. The silicon oxide film 31 may be formed as a film by, for example, a method such as sputtering. Contact holes are formed in predetermined regions of the polyimide layer 29 and the silicon oxide film 31 (the region of the coil electrode 28 and the region of the electrode 24), and electrode pads 32 and 26 are individually formed in the contact holes. The contact holes are formed using photolithography, etching, and the like. The electrode pads 32 and 26 may be formed by photolithography and plating after an electrode material has been formed as a film.

In the magnetic balance type current sensor including such a configuration as described above, as illustrated in FIG. 2, the magnetoresistance effect element 122a receives an induction magnetic field A occurring from the current to be measured, and the induction magnetic field is fed back to generate a cancelling magnetic field B from the feedback coil 121 and to appropriately adjust the cancelling magnetic field B in such a way that the two magnetic fields (the induction magnetic field A and the cancelling magnetic field B) are cancelled out and a magnetic field applied to the magnetoresistance effect element 122a becomes zero.

As illustrated in FIG. 2, the magnetic balance type current sensor according to preferred embodiments of the present invention includes the magnetic shield 30 adjacent to the feedback coil 121. The magnetic shield 30 may attenuate the induction magnetic field occurring from the current to be measured and being applied to the magnetoresistance effect element 122a (in the magnetoresistance effect element, the direction of the induction magnetic field A and the direction of the cancelling magnetic field B are opposite to each other), and the magnetic shield 30 may enhance the cancelling magnetic field B from the feedback coil 121 (in the magnetic shield, the direction of the induction magnetic field A and the direction of the cancelling magnetic field B are equal to each other). Accordingly, since the magnetic shield 30 functions as a magnetic yoke, it may be possible to reduce a current passed through the feedback coil 121 and it may be possible to achieve electric power saving. In addition, according to this magnetic shield 30, it may be possible to reduce the influence of an external magnetic field, and it may also be possible to measure a larger current value.

Owing to the existence of the magnetic shield 30, the value of linearity with respect to a full scale becomes large. Inventors of the present invention found out that one factor of the influence of the magnetic shield 30 on the linearity of an output was the magnetic domain structure (domain) of the magnetic shield 30. Therefore, in preferred embodiments of the present invention, the hard bias layer 33 is provided on or above the magnetic shield 30, thereby putting the magnetic domain structure of the magnetic shield 30 into a single magnetic domain state. Accordingly, it may be possible to reduce the influence of the magnetic hysteresis of a magnetic shield and improve the linearity of the output of a magnetoresistance effect element.

Next, an embodiment will be described that was implemented so as to clarify the advantageous effect of a magnetic balance type current sensor having the above-mentioned configuration.

A magnetic balance type current sensor was manufactured that has the configuration (a configuration where the hard bias layer is included on or above the magnetic shield) illustrated in FIG. 1 and FIG. 2 (the embodiment). In addition, a magnetic balance type current sensor was manufactured that has a configuration where no hard bias layer is included in the configuration illustrated in FIG. 1 and FIG. 2 (a comparative example).

Figure 4A:
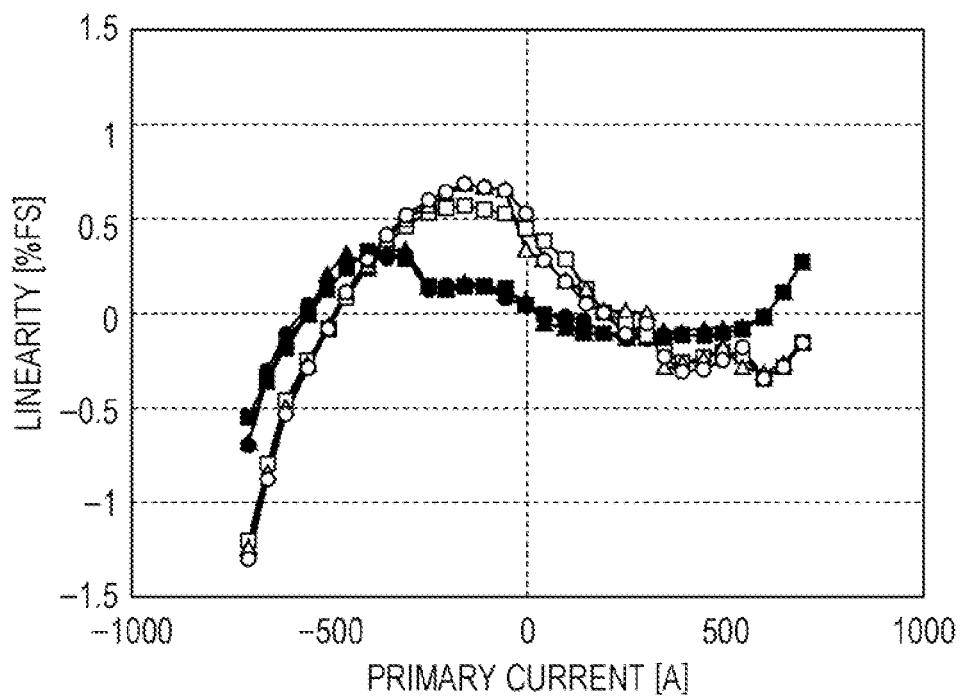
FIG. 4A is a diagram illustrating linearity of an output when a magnetic shield is provided.
Figure 4B:
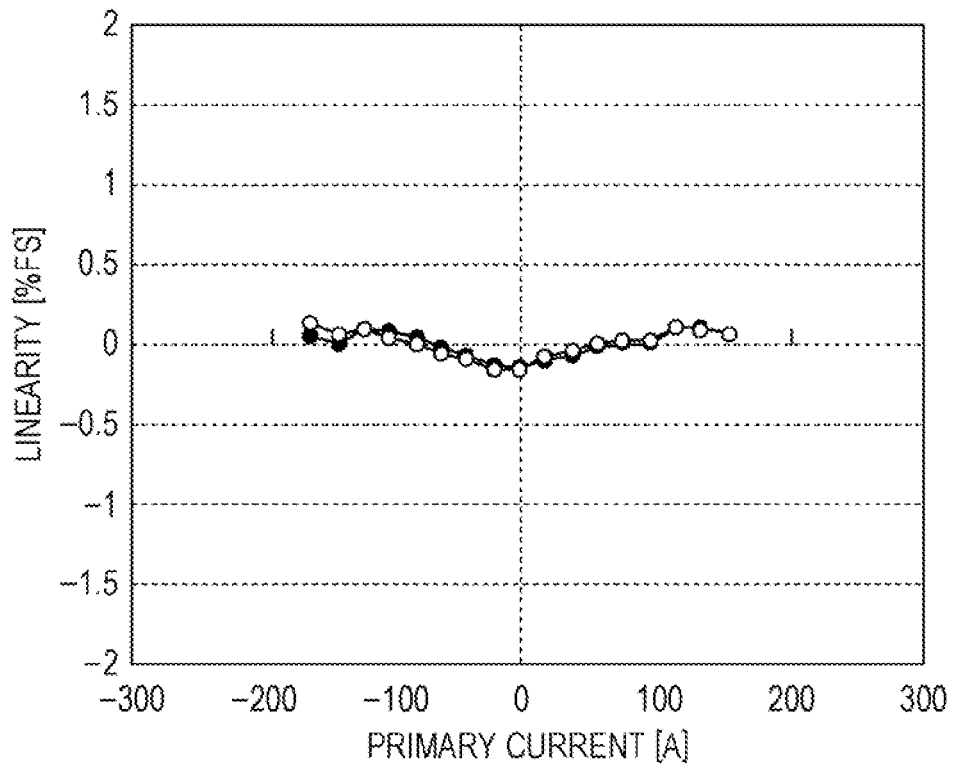
FIG. 4B is a diagram illustrating linearity of an output when a magnetic shield is not used.

The linearity of an output was studied with respect to each of the magnetic balance type current sensors of the embodiment and the comparative example. The linearity of an output was obtained by performing least squares approximation on plotted points. As a result, in the magnetic balance type current sensor of the embodiment, such a result as substantially illustrated in FIG. 4B was obtained, and good linearity was obtained. The reason may be considered to be that the magnetic domain structure of the magnetic shield was put into a single magnetic domain state owing to the hard bias layer and the influence of the magnetic hysteresis of the magnetic shield was suppressed. On the other hand, in the magnetic balance type current sensor of the comparative example, a result illustrated in FIG. 4A was obtained, the linearity thereof was deteriorated.

The present invention is not limited to the above-mentioned embodiment, and may be implemented with various modifications. For example, the present invention may be implemented with a material, a connection relationship between individual elements, a thickness, a size, a manufacturing process, and the like in the above-mentioned embodiment being arbitrarily changed. Furthermore, the present invention may be implemented with modifications being arbitrarily made without departing from the scope of the invention.

The present invention is applicable to a current sensor detecting the intensity of a current used for driving a motor in an electric automobile.

What is claimed is:

1. A magnetic balance type current sensor comprising:
   a magnetoresistance effect element whose characteristics change depending on an induction magnetic field from a current to be measured flowing through a conductor;
   a feedback coil disposed in a vicinity of the magnetoresistance effect element and configured to generate a cancelling magnetic field cancelling the induction magnetic field;
   a magnetic shield configured to attenuate the induction magnetic field and enhance the cancelling magnetic field; and
   a hard bias layer provided on or above the magnetic shield
   wherein the feedback coil is disposed between the magnetic shield and the magnetoresistance effect element, and the magnetic shield is disposed between the feedback coil and the conductor.

2. The magnetic balance type current sensor according to claim 1, wherein the hard bias layer is disposed in both end portions of the magnetic shield in a direction perpendicular to a direction of the induction magnetic field or a direction of the cancelling magnetic field in planar view, the hard bias layer including a pattern extending in the direction of the induction magnetic field or the direction of the cancelling magnetic field.

3. The magnetic balance type current sensor according to claim 1, further comprising:
   a nonmagnetic layer provided between the magnetic shield and the hard bias layer.

4. The magnetic balance type current sensor according to claim 1, wherein the magnetoresistance effect element is a spin-valve-type GMR element or a spin-valve-type TMR element.

5. The magnetic balance type current sensor according to claim 1, wherein the magnetic shield is formed of a high magnetic permeability material selected from a group consisting of an amorphous magnetic material, a permalloy-based magnetic material, and an iron-based microcrystalline material.

6. The magnetic balance type current sensor according to claim 1, wherein the hard bias layer is formed of a hard magnetic material.

* * * * *